(12) United States Patent
Kazue

(10) Patent No.: US 12,237,263 B2
(45) Date of Patent: Feb. 25, 2025

(54) SEMICONDUCTOR APPARATUS AND EQUIPMENT

(71) Applicant: CANON KABUSHIKI KAISHA, Tokyo (JP)

(72) Inventor: Yuichi Kazue, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/638,933

(22) Filed: Apr. 18, 2024

(65) Prior Publication Data

US 2024/0266281 A1    Aug. 8, 2024

Related U.S. Application Data

(63) Continuation of application No. 18/157,916, filed on Jan. 23, 2023, now Pat. No. 11,990,402, which is a
(Continued)

(30) Foreign Application Priority Data

Aug. 8, 2019 (JP) ................................ 2019-146826

(51) Int. Cl.
*H01L 23/522* (2006.01)
*H01L 27/146* (2006.01)

(52) U.S. Cl.
CPC .... *H01L 23/5226* (2013.01); *H01L 27/14627* (2013.01); *H01L 27/14636* (2013.01)

(58) Field of Classification Search
CPC ........... H01L 23/5226; H01L 27/14627; H01L 27/14636; H01L 21/76898; H01L 27/1462; H01L 27/14634
See application file for complete search history.

(56) References Cited

U.S. PATENT DOCUMENTS 7,868,336 B2   1/2011   Fujimoto et al.
9,041,161 B2   5/2015   Takachi et al.
(Continued)

FOREIGN PATENT DOCUMENTS

JP   11-204560 A   7/1999
JP   2008-140819 A   6/2008
(Continued)

OTHER PUBLICATIONS

Notice of Reasons for Refusal in Japanese Patent Application 2023-104520 (May 2024).

*Primary Examiner* — Jonathan Han
(74) *Attorney, Agent, or Firm* — Venable LLP

(57) ABSTRACT

A semiconductor apparatus comprising a first substrate, a second substrate coupled with the first substrate via an insulating member, a third substrate coupled to the first substrate and disposed on the opposite side to the second substrate and a conductive layer including an electrode disposed between the first and second substrate is provided. A through via is disposed so as to pass through the second substrate and a part of the insulating member to reach the electrode. An opening is arranged overlapping the electrode in the first substrate and a part of the insulating member. First and second resin layers are disposed between the electrode and the third substrate, and the first resin layer is disposed within the opening, is disposed between the electrode and the second resin layer and has a different Young's modulus from the second resin layer.

18 Claims, 11 Drawing Sheets

Related U.S. Application Data continuation of application No. 16/942,944, filed on Jul. 30, 2020, now Pat. No. 11,699,653.

(56) References Cited

U.S. PATENT DOCUMENTS

| | | | |
|---|---|---|---|
| 2007/0108578 | A1 | 5/2007 | Watanabe |
| 2008/0128848 | A1 | 6/2008 | Suzuki et al. |
| 2008/0217791 | A1 | 9/2008 | Kojima et al. |
| 2010/0207224 | A1 | 8/2010 | Saito et al. |
| 2012/0217604 | A1 | 8/2012 | Shibuki |
| 2012/0298993 | A1 | 11/2012 | Nagata |
| 2016/0284753 | A1* | 9/2016 | Komai .............. H01L 27/14645 |
| 2017/0263665 | A1 | 9/2017 | Komai et al. |
| 2018/0061879 | A1* | 3/2018 | Kurihara ........... H01L 27/14632 |
| 2018/0097029 | A1 | 4/2018 | Kurihara et al. |
| 2018/0233524 | A1* | 8/2018 | Kazue ............... H01L 27/14636 |
| 2019/0214418 | A1 | 7/2019 | Sasaki et al. |
| 2022/0157873 | A1 | 5/2022 | Komai et al. |

FOREIGN PATENT DOCUMENTS

| | | |
|---|---|---|
| JP | 2009-147292 A | 7/2009 |
| JP | 2010-267736 A | 11/2010 |
| JP | 2015-135938 A | 7/2015 |
| JP | 2018-61000 A | 4/2018 |

\* cited by examiner

F I G. 5C
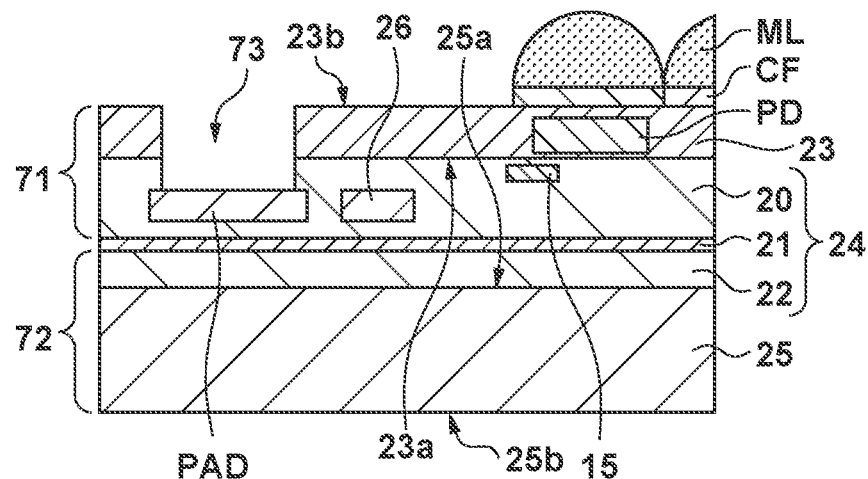
F I G. 5D
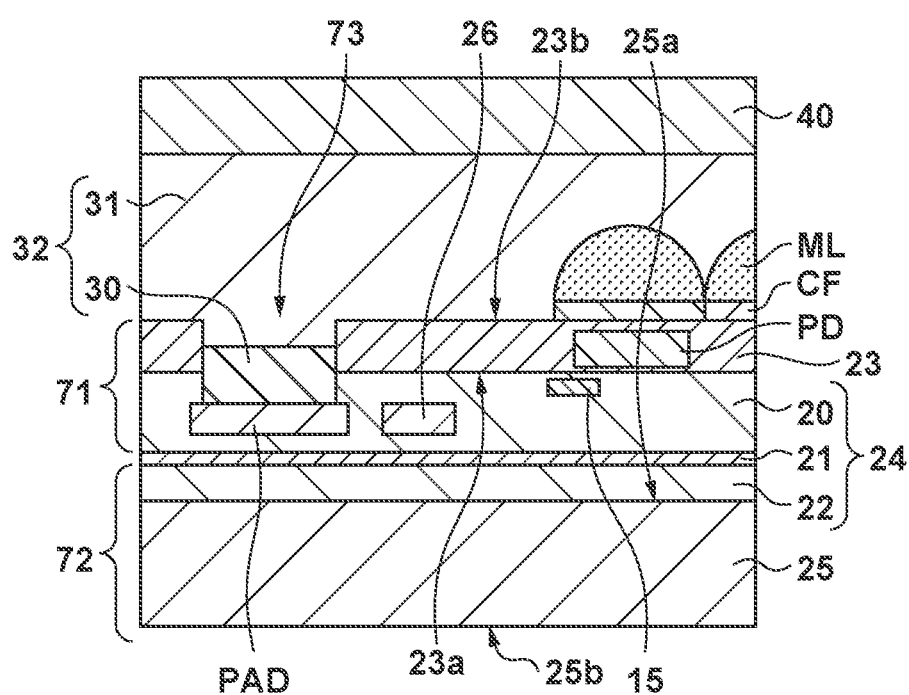

SEMICONDUCTOR APPARATUS AND EQUIPMENT

CROSS REFERENCE TO RELATED APPLICATIONS

This application is a continuation application of U.S. patent application Ser. No. 18/157,916, filed Jan. 23, 2023, which is a continuation application of U.S. patent application Ser. No. 16/942,944, filed Jul. 30, 2020, now U.S. Pat. No. 11,699,653, which claims the benefit of Japanese Patent Application No. 2019-146826, filed Aug. 8, 2019. Each of these prior applications is hereby incorporated by reference herein in its entirety.

BACKGROUND OF THE INVENTION

Field of the Invention

The present disclosure relates to a semiconductor apparatus and an equipment.

Description of the Related Art

A through via is a known semiconductor apparatus mounting technology. Japanese Patent Laid-Open No. 2018-61000 describes a solid-state image capturing element comprising a through via that, when a semiconductor substrate and a support substrate are attached, passes through the support substrate and reaches an input and output pad arranged in a peripheral circuit region of the semiconductor substrate. Also, Japanese Patent Laid-Open No. 2018-61000 describes prior to forming a through via, forming, on a side of a semiconductor substrate of an input and output pad, a through-hole for performing an inspection such as a peripheral circuit operation confirmation.

SUMMARY OF THE INVENTION

In a case where a through-hole is formed on a side of a semiconductor substrate of an input and output pad, when a through via is also formed, the support of the input and output pad is weakened, and therefore there is the possibility of a break/damage between an interlayer insulation layer and the input and output pad or to the input and output pad itself due to a stress or the like. In a case of a break/damage between an interlayer insulation layer and an input and output pad or to the input and output pad itself, reliability suffers.

Some embodiments of the present invention provide a technique that advantageously improves a reliability of a semiconductor apparatus comprising a plurality of substrates and a through via.

According to some embodiments, a semiconductor apparatus, comprising: a first substrate; an insulating member; a second substrate coupled with the first substrate via the insulating member; a third substrate coupled to the first substrate, the first substrate being disposed between the second substrate and the third substrate; and a conductive layer disposed between the first substrate and the second substrate, wherein the insulating member comprises a first insulating layer positioned between the conductive layer and the first substrate, and comprises a second insulating layer positioned between the conductive layer and the second substrate, the conductive layer comprises an electrode pad, a through via is disposed so as to pass through the second substrate and the second insulating layer to reach the electrode pad, an opening is arranged at a position overlapping the electrode pad, and is arranged in the first substrate and the first insulating layer, and between the electrode pad and the third substrate, a first resin layer and a second resin layer are disposed, and the first resin layer is disposed within the opening, is disposed between the electrode pad and the second resin layer, and has a different Young's modulus from the second resin layer, is provided.

Further features of the present invention will become apparent from the following description of exemplary embodiments (with reference to the attached drawings).

BRIEF DESCRIPTION OF THE DRAWINGS

FIGS. 5A to 5H are cross-sectional views illustrating a method of manufacturing the semiconductor apparatus of FIG. 1.

DESCRIPTION OF THE EMBODIMENTS

Figure 1:
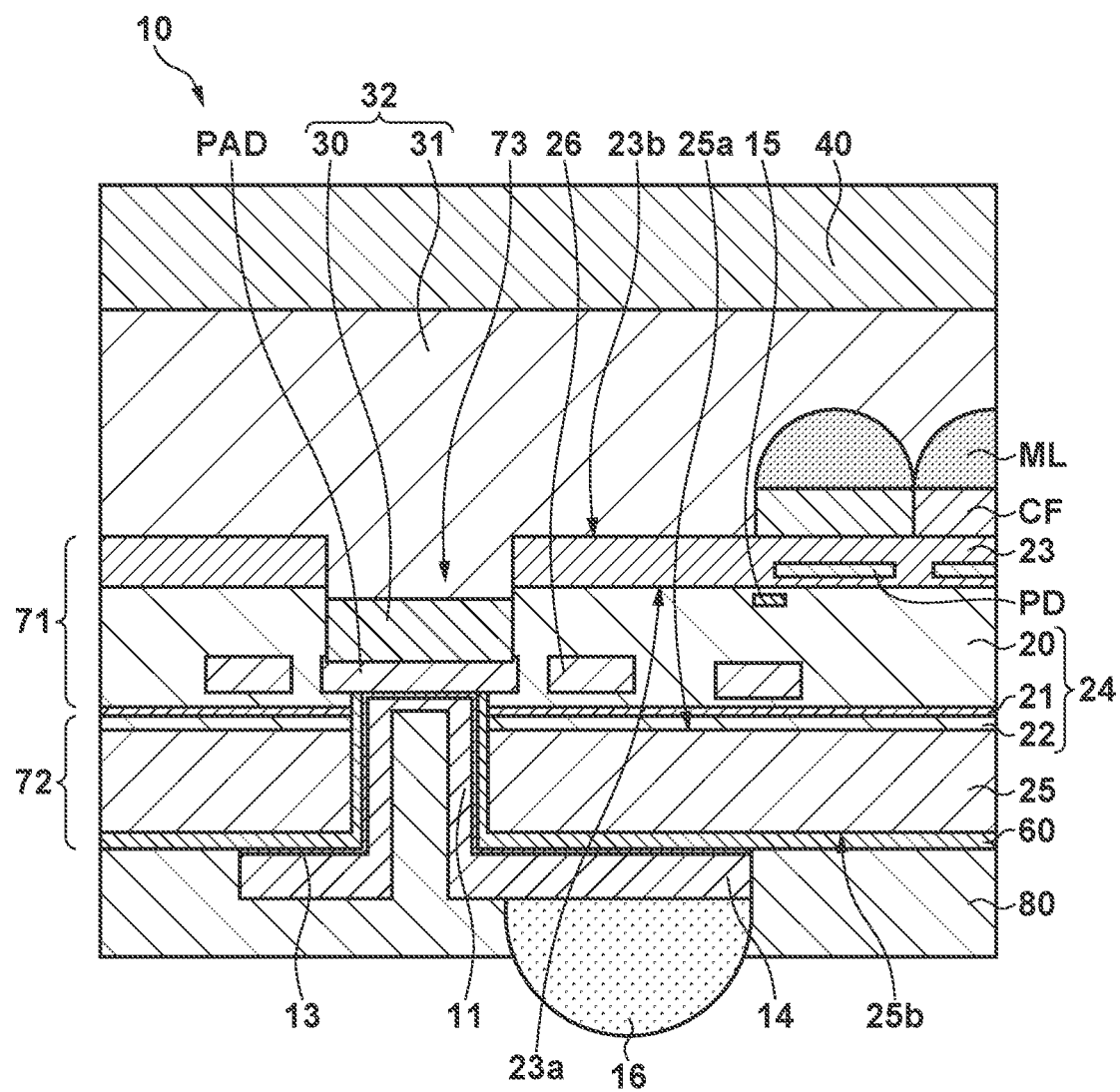
FIG. 1 is a cross-sectional view illustrating a structure of a semiconductor apparatus in the present embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

With reference to FIG. 1 to FIG. 7B, a structure of a semiconductor apparatus according to the present embodiment and method of manufacturing the same will be described. FIG. 1 is a cross-sectional view illustrating an example of a configuration of a semiconductor apparatus 10 in the present embodiment.

In the present embodiment, the semiconductor apparatus 10 includes a substrate 23, a substrate 25 coupled to the substrate 23 via an insulating member 24, and a substrate 40 coupled with the substrate 23. As illustrated in FIG. 1, the substrate 23 is disposed between the substrate 25 and the substrate 40.

The substrate 23 is a semiconductor substrate made of silicon or the like, for example. In the present embodiment, on a side of a surface 23a of the substrate 23, a plurality of semiconductor elements 15 are disposed (In FIG. 1, only one semiconductor element 15 is illustrated). Also, in the present embodiment, on the substrate 23, a photoelectric conversion element PD such as a PN diode is disposed. That is, it can also be said that the plurality of semiconductor elements 15 include a photoelectric conversion element PD. Also, the plurality of the semiconductor elements 15 may include various elements such as a transistor for transferring a signal into which light is converted by a photoelectric conversion element PD.

In the present specification, description is given using a photoelectric conversion apparatus in which a photoelectric conversion element PD is disposed as an example of the semiconductor apparatus 10. Also, the semiconductor apparatus 10 of the present embodiment is a so-called back-illuminated type photoelectric conversion apparatus. However, the semiconductor apparatus 10 is not limited to this. For example, the semiconductor apparatus 10 may be a front-illuminated type photoelectric conversion apparatus. In such a case, the semiconductor element 15 may be disposed on a side of a surface 23b of the substrate 23. Also, the present embodiment is not limited to a photoelectric conversion apparatus, and may be applied to various semiconductor apparatuses such as a processor or a memory, for example, in which a substrate is attached, and a later-described through via 11 is disposed.

The insulating member 24 includes an insulating layer 20 positioned between a conductive layer 26 and the substrate 23 and an insulating layer 22 positioned between the conductive layer 26 and the substrate 25. The insulating layer 20 is disposed on the surface 23a of the substrate 23. Also, the insulating layer 22 is disposed on a surface 25a of the substrate 25. Also, the insulating member 24 includes an insulating layer 21 disposed between the insulating layer 20 and the insulating layer 22. The insulating layer 21 may be, for example, an adhesive agent or the like for coupling the substrate 23 and the substrate 25. In the configuration illustrated in FIG. 1, the insulating layer 21 is positioned between the conductive layer 26, which includes an electrode pad PAD, and the substrate 25.

A material such as silicon oxide may be used for the insulating layer 20. Also, silicon carbide, silicon nitride, silicon oxynitride, or the like is used for the insulating layer 20. Also, a combination of these materials may be used for the insulating layer 20. For example, silicon oxide may be used mainly and silicon carbide and silicon nitride may be used ancillarily as the insulating layer 20.

The conductive layer 26 is disposed between the substrate 23 and the substrate 25. The conductive layer 26 includes the electrode pad PAD and a wiring pattern. The insulating layer 20 of the insulating member 24 may function as an interlayer insulation layer or the like between a semiconductor element 15 disposed in the substrate 23 and the conductive layer 26. Various conductive materials such as aluminum, titanium, tantalum, tungsten, or copper may be used for the conductive layer 26. Also, in the periphery of the conductive layer 26, an anti-diffusion layer, for preventing the foregoing metal or the like from diffusing into the insulating layer 20, may be disposed. In the configuration illustrated in FIG. 1, the conductive layer 26 is illustrated as only one layer, but the conductive layer 26 may be a multi-layered wiring structure disposed over a plurality of layers. The conductive layer 26 may be connected electrically with the semiconductor element 15 including the photoelectric conversion element PD. The combination of the substrate 23, on which the semiconductor element 15 including the photoelectric conversion element PD is disposed, and the insulating layer 20 including the conductive layer 26 on the substrate 23 may also be referred to as a sensor substrate 71.

Between the surface 23b of the substrate 23 and the substrate 40, a color filter CF and a microlens ML for improving a rate of focus on the photoelectric conversion element PD are disposed. The color filter CF and the photoelectric conversion element PD, as illustrated in FIG. 1, may be disposed between the surface 23b of the substrate 23 and a resin member 32 (a resin layer 31) so as to each correspond to the photoelectric conversion element PD.

An opening 73 is arranged at a position overlapping the electrode pad PAD in the substrate 23 and the insulating layer 20. In the opening 73, the resin member 32 including a resin layer 30 and the resin layer 31 is filled. The resin member 32 filled into the opening 73 will be described later.

The substrate 25 is a semiconductor substrate made of silicon or the like, for example. However, limitation is not made to this, and various materials may be used if the substrate can form the through via 11. The substrate 25 or the combination of the substrate 25 and the insulating layer 20 may be referred to as a support substrate 72. As described above, the insulating layer 21, which may be an adhesive agent, is disposed between the insulating layer 20 and the insulating layer 22. Accordingly, it can be said the insulating layer 21 is coupled with the sensor substrate 71 and the support substrate 72.

As illustrated in FIG. 1, a via that reaches the electrode pad PAD through the substrate 25 and the insulating layer 22 is arranged and the through via 11 that reaches the electrode pad PAD is disposed on the via. More specifically, an insulating member 60 is disposed the side wall of the via and on a surface 25b of the substrate 25, and a conductive pattern 14 on the surface 25b of the substrate 25 and the through via 11 are respectively formed on the inside of the via by a conductor being formed on the insulating member 60. The insulating member 60 may cover the entirety of the surface 25b of the substrate 25 other than the part at which the via is disposed. Between the through via 11 and the conductive pattern 14 and the insulating member 60, as illustrated in FIG. 1, a seed layer 13 that functions as a barrier metal and a seed metal is disposed. On the insulating member 60 and the conductive pattern 14, a protective film 80 is disposed so as to cover the surface 25b of the substrate 25.

Next, the resin member 32 will be described. The resin member 32 includes the resin layer 30 which is arranged in the opening 73 arranged at the substrate 23 and the insulating layer 20 and the resin layer 31. The resin layer 30 is disposed between the electrode pad PAD and the resin layer 31. In the present embodiment, the resin layer 30 contacts the electrode pad PAD, and the resin layer 31 does not contact the electrode pad PAD. The resin layer 31, as illustrated in FIG. 1, covers the electrode pad PAD via the resin layer 30. Also, the resin layer 30, as illustrated in FIG. 1, may cover all of the parts of the electrode pad PAD exposed in the opening 73. Also, in the present embodiment, the resin layer 31 contacts the surface facing the substrate 23 in the substrate 40 which includes a light transmissive plate, and functions as a coupling layer that couples the substrate 23 and the substrate 40. In such a case, the resin layer 31 may be referred to as an adhesive layer. For example, the resin layer 31 may contact a part of the substrate 40 that faces the electrode pad PAD, the microlens ML, the color filter CF, or the photoelectric conversion element PD. However, there is no limitation to this, and a layer such as a resin layer other than the resin layer 31 may be disposed between the resin layer 31 and the substrate 40 so as to couple the substrate 23 and the substrate 40.

Also, in the present embodiment, the resin layer 30 has a higher Young's modulus than the resin layer 31. In other words, it can be said that the resin layer 30 is more rigid than the resin layer 31. The Young's modulus of the resin layer 30 may be 10 times or more the Young's modulus of the resin layer 31. Also, the Young's modulus of the resin layer 31 may be 1 GPa or more and 2 GPa or less. Accordingly, the Young's modulus of the resin layer 30 may be 10 GPa or more and may be 20 GPa or more.

The plurality of resin layers with different Young's moduli (the resin layers 30 and 31 in the present embodiment) are disposed in the opening 73 which opens up to the electrode pad PAD. Thereby, when forming the through via 11, the support rigidity for supporting the electrode pad PAD can be enhanced by the resin layer 30 whose Young's modulus is high, and thereby stability of the manufacturing process can be improved and the yield rate can be increased. Also, stress on the insulating layer 21 due to expansion and contraction of the metal in the through via 11 due to environmental factors such as the temperature in the usage environment of the semiconductor apparatus 10 can be dispersed to the resin layer 31 and alleviated by the resin layer 31 whose Young's modulus is lower than the resin layer 30 being disposed. Thereby, it is possible to improve the reliability of the completed semiconductor apparatus 10. By using the configuration illustrated FIG. 1, it becomes possible to improve the reliability during manufacture and post-manufacture in the semiconductor apparatus 10 in which a plurality of substrates are attached, and the through via 11 is disposed. Note that the higher/lower Young's modulus relationship between the resin layers 30 and 31 may be the opposite, and the positions of the resin layers 30 and 31 may be 31 may be the opposite. The reliability of the semiconductor apparatus 10 is similarly improved in such a case compared to when only one of the resin layer with the higher Young's modulus and the resin layer with the lower Young's modulus is used.

In the present embodiment, in the opening 73, two resin layers (the resin layer 30 and the resin layer 31) are disposed, but there is no limitation to this, and three or more layers may be disposed. Also, an inorganic layer that acts as an antireflection film may be disposed in a region in which the photoelectric conversion element PD is disposed between the resin layer 30 and the resin layer 31, for example.

Next, using FIG. 2, a variation of the semiconductor apparatus 10 will be described. In the configuration illustrated in FIG. 1, the resin layer 30 is filled into a space within the opening 73 to a predetermined height from the electrode pad PAD. Also, on the resin layer 30, the resin layer 31 covers a part in the side surface of the opening 73 without intervention of the resin layer 30. Meanwhile, in the configuration illustrated in FIG. 2, the resin layer 30 continuously covers the bottom surface of the opening 73 at which the electrode pad PAD is exposed, the side surfaces of the opening 73, and the surface 23b of the substrate 23 facing the substrate 40. The resin layer 30 may cover the entirety of the surface 23b of the substrate 23. Also, the resin layer 31 covers the bottom surface and the side surface of the opening 73 via the resin layer 30.

Figure 2:
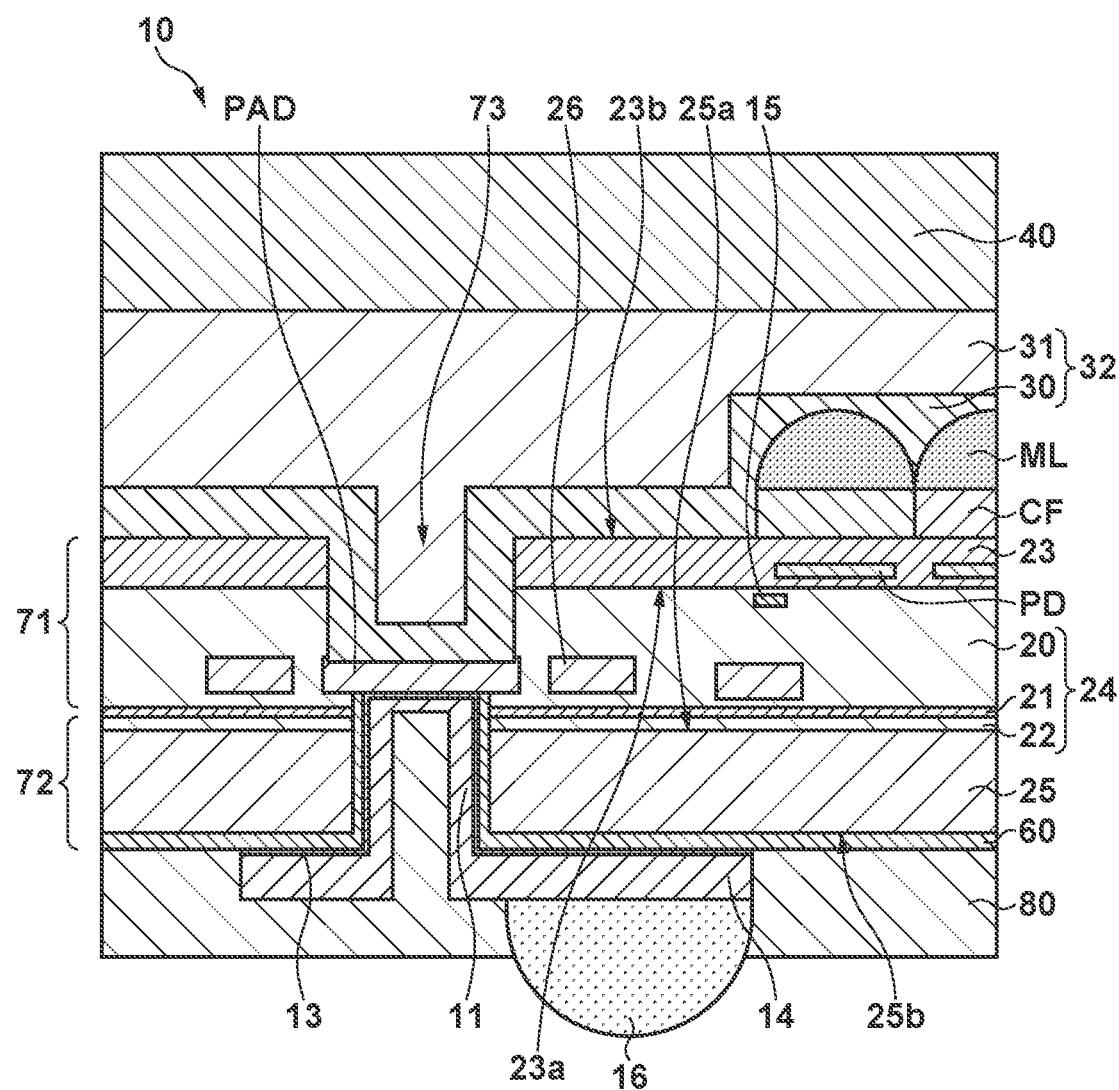
FIG. 2 is a cross-sectional view illustrating a variation of the semiconductor apparatus of FIG. 1.

In the configuration illustrated in FIG. 2, the microlens ML is disposed between the surface 23b of the substrate 23 and the resin member 32 (the resin layer 30). In other words, the resin layer 31 covers the microlens ML. The refractive index of the resin layer 30 may be lower than the refractive index of the microlens ML. By making the refractive index of the resin layer 30 lower than the microlens ML, it is possible to increase the rate of focus on the photoelectric conversion element PD disposed in the substrate 23. For example, the refractive index of the resin layer 30 may be 1.25 or less and the refractive index of the microlens ML 1.5 or more. Thereby, the rate of focus on the photoelectric conversion element PD is increased.

Even in the configuration illustrated in FIG. 2, the resin layer 30 and the resin layer 31 whose Young's modulus is lower than the resin layer 30 are disposed in the opening 73 arranged at a position overlapping the substrate 23 and the electrode pad PAD of the insulating layer 20. Accordingly, similarly to the structure illustrated in FIG. 1, when the through via 11 is formed, it becomes possible to enhance the supporting rigidity for support of the electrode pad PAD by the resin layer 30 whose Young's modulus is high. Also, by the resin layer 31, whose Young's modulus is lower than the resin layer 30, being disposed, it becomes possible for the stress on the insulating layer 21 due to expansion and contraction of the metal of the through via 11 to be dispersed to the resin layer 31 and alleviated. Thereby, it becomes possible to enhance the reliability during manufacture and post-manufacture in the semiconductor apparatus 10 in which the substrate is attached and the through via 11 is disposed. Also, the resin layer 30 is arranged on the microlens ML and the refractive index of the resin layer 30 is made to be lower than the refractive index of the microlens ML. Thereby, it becomes possible to improve the rate of focus on the photoelectric conversion element PD over the configuration illustrated in FIG. 1.

Using FIG. 3, another variation of the semiconductor apparatus 10 will be described. The configuration of a support substrate 74 differs from the support substrate 72 illustrated in FIG. 1 in the semiconductor apparatus 10 illustrated in FIG. 3. More specifically, a plurality of a semiconductor element 28 which is a transistor or the like are disposed on the surface 25a of the substrate 25 in the support substrate 74. Also, a conductive layer 27 which is electrically connected to the semiconductor element 28 is disposed on the insulating layer 22 in the support substrate 74. Accordingly, the insulating layer 22 may function as an interlayer insulation layer or the like between the semiconductor element 28 disposed on the substrate 25 and a conductive layer 27. Also, the conductive layer 27 includes the electrode pad PAD which is electrically connected via the through via 11 to the conductive pattern 14 which is disposed on the surface 25b of the substrate 25. Also, in the configuration illustrated in FIG. 3, the insulating layer 21 is positioned between the conductive layer 27 including the electrode pad PAD and the substrate 23. In the configuration illustrated in FIG. 3, the conductive layer 27 is illustrated as only one layer, but the conductive layer 27 may be a multi-layered wiring structure arranged across a plurality of layers. A similar material to the above-described substrate 23 may be used for the substrate 25. Also, a similar material and structure to the above-described conductive layer 26 may be used for the conductive layer 27.

Figure 3:
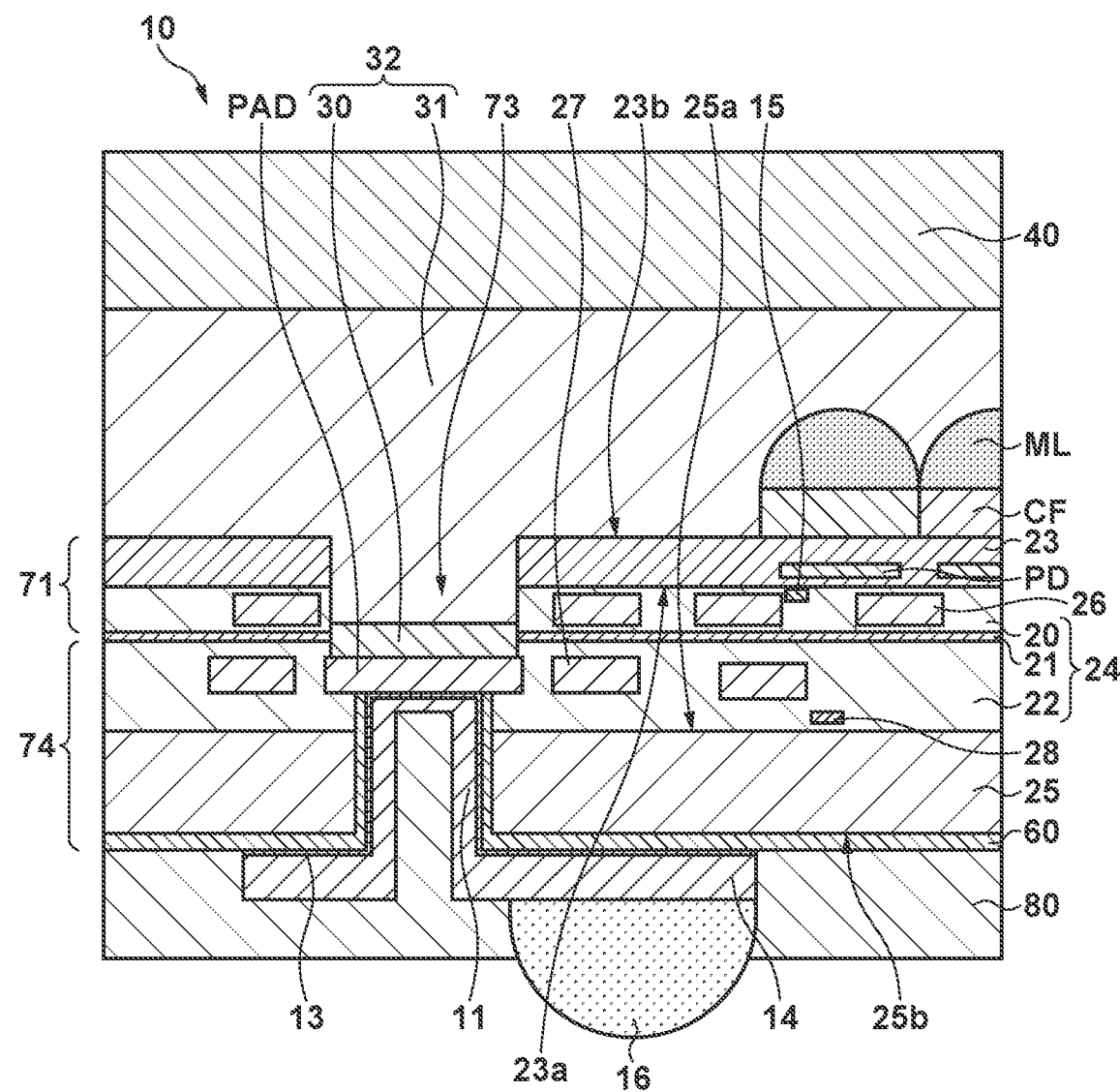
FIG. 3 is a cross-sectional view illustrating a variation of the semiconductor apparatus of FIG. 1.

In the configuration illustrated in FIG. 3, the opening 73 is arranged at a position overlapping the electrode pad PAD in the substrate 23 and the insulating layer 20, and the resin layer 30 and the resin layer 31 whose Young's modulus is lower than the resin layer 30 are arranged in the opening 73. Accordingly, similarly to the structure illustrated in FIGS. 1 and 2, when forming the through via 11, it is possible to improve support rigidity of the support of the electrode pad PAD by the resin layer 30 with the high Young's modulus. Also, by the resin layer 31, whose Young's modulus is lower than the resin layer 30, being disposed, it becomes possible for the stress on the insulating layer 21 due to expansion and contraction of the metal of the through via 11 to be dispersed to the resin layer 31 and alleviated. Thereby, it becomes possible to enhance the reliability during manufacture and post-manufacture in the semiconductor apparatus 10 in which the substrate is attached and the through via 11 is disposed. Also, by the conductive layer 27 which is a wiring pattern or the like being disposed in the support substrate 74, it is possible to improve a degree of freedom in designing the conductive layer 26 of the sensor substrate 71.

Using FIG. 4, another variation of the semiconductor apparatus 10 will be described. In the configuration illustrated in FIG. 4, the support substrate 74 is being used as a substrate for supporting the sensor substrate 71, similarly to in the configuration illustrated in FIG. 3. Also, similarly to the configuration illustrated in FIG. 2, the resin layer 30 continuously covers the surface of the opening 73 and the surface 23b of the substrate 23.

Figure 4:
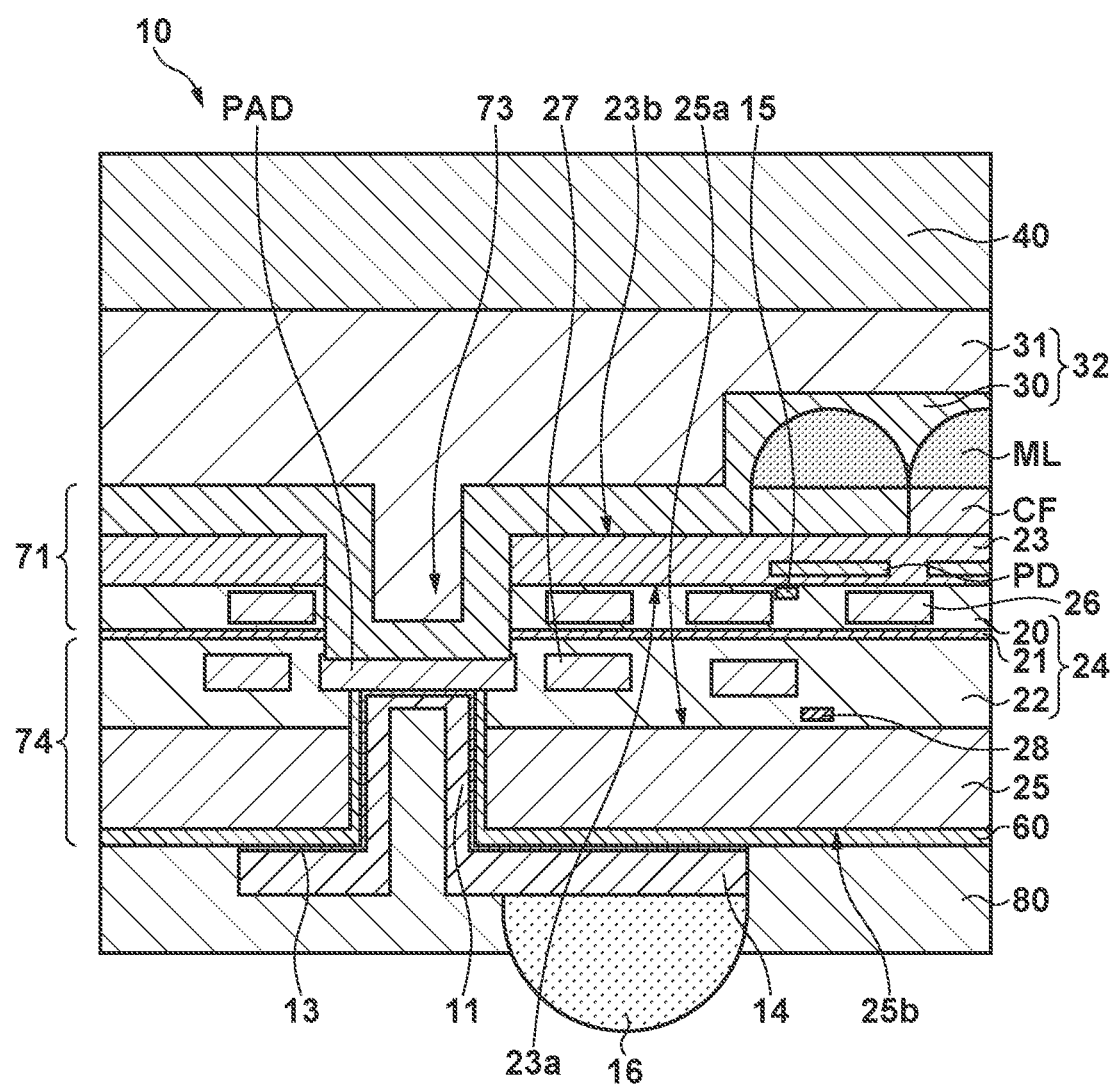
FIG. 4 is a cross-sectional view illustrating a variation of the semiconductor apparatus of FIG. 1.

In the configuration illustrated in FIG. 4, the opening 73 is arranged at a position overlapping the electrode pad PAD in the substrate 23 and the insulating layer 20, and the resin layer 30 and the resin layer 31 whose Young's modulus is lower than the resin layer 30 are arranged in the opening 73. Accordingly, similarly to the structure illustrated in FIGS. 1 to 3, when forming the through via 11, it is possible to improve support rigidity of the support of the electrode pad PAD by the resin layer 30 with the high Young's modulus. Also, by the resin layer 31, whose Young's modulus is lower than the resin layer 30, being disposed, it becomes possible for stress on the insulating layer 21 due to expansion and contraction of the metal of the through via 11 to be dispersed to the resin layer 31 and alleviated. Thereby, it becomes possible to enhance the reliability during manufacture and post-manufacture in the semiconductor apparatus 10 in which the substrate is attached and the through via 11 is disposed. Also, by the conductive layer 27 being disposed in the support substrate 74, it is possible to improve a degree of freedom in designing the conductive layer 26 of the sensor substrate 71. Also, the resin layer 30 is arranged on the microlens ML and the refractive index of the resin layer 30 is made to be lower than the refractive index of the microlens ML. Thereby, it becomes possible to improve the rate of focus on the photoelectric conversion element PD over the configuration illustrated in FIG. 3.

Next, using FIGS. 5A to 5H, a method of manufacturing the semiconductor apparatus 10 in the present embodiment will be described. FIGS. 5A to 5H are schematic sectional views for describing each step in manufacturing the semiconductor apparatus 10. In manufacturing the semiconductor apparatus 10, a publicly known semiconductor manufacturing process may be used. Also, while description is omitted here, heat processing, cleaning process, and the like may be performed as necessary between the respective steps illustrated in FIGS. 5A to 5H.

Figure 5A:
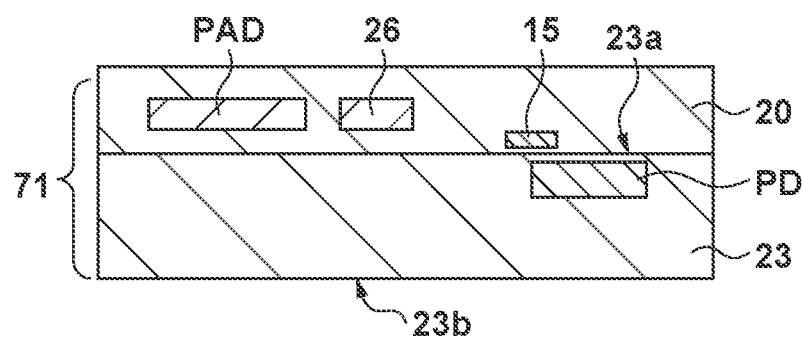

In the step illustrated in FIG. 5A, the sensor substrate 71 which includes the substrate 23 and the insulating layer 20 is formed. First, a plurality of the semiconductor element 15 including the photoelectric conversion element PD, a transistor, or the like are formed on the substrate 23. Next, the conductive layer 26 including the electrode pad PAD is formed on the surface 23a of the substrate 23, and the insulating layer 20 is disposed between the conductive layer 26 and the substrate 23. In the substrate 23, an element separation region such as an STI (Shallow Trench Isolation) may be formed, and each of the semiconductor element 15 such as the photoelectric conversion element PD or the like may be electrically isolated from other elements by the element separation region. After that, ion injection and heat processing is performed as necessary in order to form a well or form a photodiode, and the substrate 23, in which are formed the plurality of the semiconductor element 15 including the photoelectric conversion element PD, is formed. Further, on the surface 23a of the substrate 23, the insulating layer 20 and the conductive layer 26 including the electrode pad PAD and the wiring pattern are formed. Also, an electrically conductive member (not shown) such as a contact for electrically connecting between the conductive layer 26 and the semiconductor element 15 such as the photoelectric conversion element PD is formed within the insulating layer 20. Silicon oxide, silicon nitride, silicon oxynitride, or the like is used as the insulating layer 20.

In the present embodiment, as one part of the insulating layer 20, a BPSG (Boron Phosphorus Silicon Glass) film was first formed by a sub-atmospheric pressure CVD method. Though not shown graphically for simplicity of the figure, a contact plug in which a conductive material such as tungsten is embedded is formed within the insulating layer 20 (BPSG film). Next, in a conductive layer 26 including an electrode PAD and a wiring pattern within the insulating layer 20 (BPSG film), a conductive material such as Al, for example, was deposited by a sputtering method, and the layer was formed by patterning by dry etching. Above the wiring pattern and the electrode pad PAD, a silicon oxide film was formed once again by a plasma CVD method as one part of the insulating layer 20. After that, smoothing of the top surface of the insulating layer 20 was performed through a step using CMP (Chemical Mechanical Polishing) or the like.

Figure 5B:
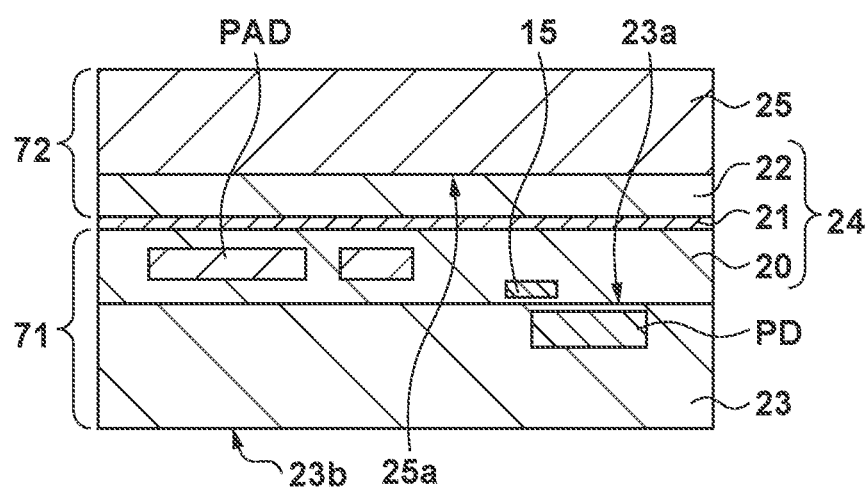
Figure 5E:
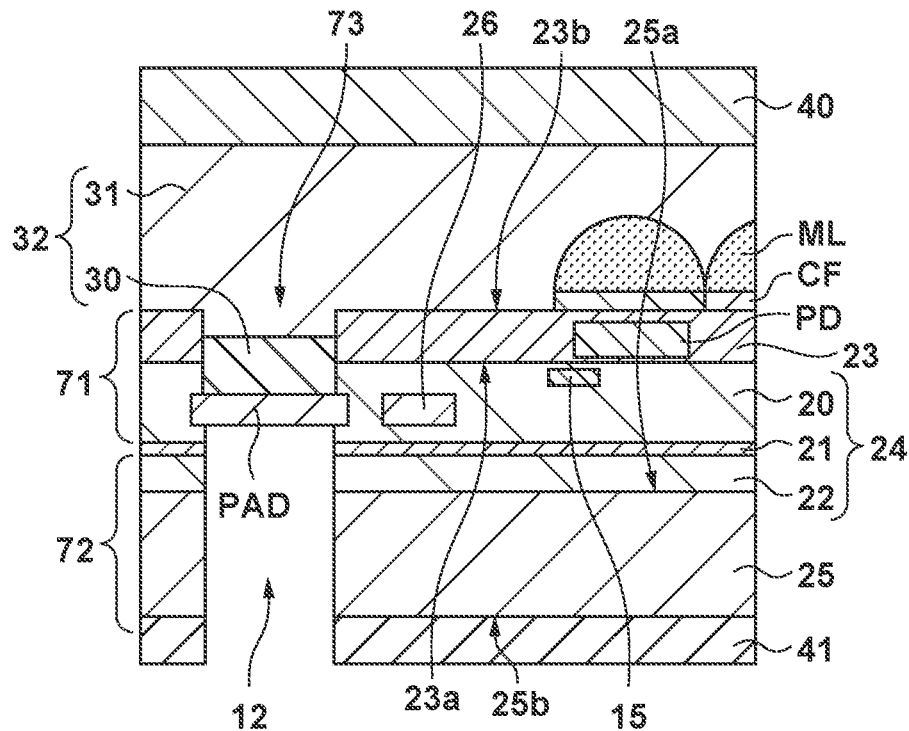

Next, in a step illustrated in FIG. 5B, the substrate 25 (the support substrate 72) comprising the smooth insulating layer 22 on the side of the surface 25a facing the substrate 23 and the sensor substrate 71 are attached. As described above, the sensor substrate 71 and the support substrate 72 are coupled by an insulating layer 21 such as an adhesive agent disposed between the insulating layer 20 and the insulating layer 22. In the description using FIGS. 5A to 5H, a method for manufacturing a semiconductor apparatus 10 is described with the semiconductor apparatus 10 comprising the configuration illustrated in FIG. 1 described above is given as an example, but a support substrate 74 as illustrated in FIGS. 3 and 4 may be used at that time as a support substrate. In such a case, the electrode pad PAD may be arranged on the conductive layer 27 on the support substrate 74 rather than the sensor substrate 71. Accordingly, when forming the through-hole 12 in which the through via 11 described later using FIG. 5E is disposed, the amount of the component of the insulating member 24 to be etched is reduced, and it is possible to simplify the etching of the through-hole 12.

After the substrate 23 (the sensor substrate 71) and the substrate 25 (the support substrate 72) are attached, in the step illustrated in FIG. 5C, first, by a back grinding process or CMP processing of the side of the surface 23b of the substrate 23, the thickness of the substrate 23 is reduced to about the thickness of the photoelectric conversion element PD by thinning. After that, cleaning or the like is performed, and the color filter CF and the microlens ML are formed at a position corresponding to each photoelectric conversion element PD of the surface 23b of the substrate 23. Also, at a position overlapping the electrode pad PAD, the opening 73, which opens through the substrate 23 and the insulating layer 20 and to the electrode pad PAD of the conductive layer 26, is formed. By causing the electrode pad PAD to be exposed, it is possible to cause a probe to contact the electrode pad PAD, and perform a characteristics inspection of the photoelectric conversion element PD or the like formed on the sensor substrate 71.

Next, in the step illustrated in FIG. 5D, the resin member 32 including the resin layers 30 and 31 arranged in the opening 73 is formed. The resin layer 30 can be given a higher Young's modulus (rigidity) than the resin layer 31 by using a resin containing at least one of glass filler, chained silica, hollow silica or the like, for example. In the present embodiment, an acrylic resin with a Young's modulus enhanced by the above-described material being caused to be dispersed within the resin is applied on the electrode pad PAD of the opening 73, and thereby the resin layer 30 is formed. At that time, the resin layer 30 may be formed by applying the resin layer 30 to the entire surface 23b of the substrate 23 including the opening 73 and not just the opening 73 in which the electrode pad PAD is exposed, as illustrated in FIGS. 2 and 4.

After having formed the resin layer 30, the resin layer 31 whose Young's modulus is lower than the resin layer 30 is formed. In the present embodiment, the resin layer 31, which serves as a coupling layer for coupling the surface 23b of the substrate 23 and the substrate 40 which is a light transmissive plate, is formed by application, for example, and the substrate 40 which is a light transmissive plate is attached on top of it. After coupling the substrate 23 and the substrate 40 as necessary, thinning of the substrate 25 may be performed by using back grinding processing or the like. In the present embodiment, as the substrate 40 which is a light transmissive plate, a quartz glass with a thickness of 0.5 mm is bonded to a side of the surface 23b of the substrate 23 by the resin layer 31 which functions as a coupling agent (adhesive agent). After the substrate 40 and the substrate 23 are coupled, the substrate 25 is thinned to a thickness of 0.2 mm by back grinding processing. In the present embodiment, the quartz glass is used as the substrate 40, but an appropriate material, such as alkali-free glass, plastic, or the like, may be used as the substrate 40 in accordance with conditions necessary for the semiconductor apparatus 10, the photoelectric conversion element PD, or the like.

In the step illustrated in FIG. 5E, the mask pattern 41 is formed on the surface 25b on the opposite side of the side of the substrate 23 of the substrate 25. Next, etching is performed via the opening of the mask pattern 41 from the side of the surface 25b of the substrate 25, and the through-hole 12 which reaches the electrode pad PAD through the substrate 25 and the insulating layer 22 is formed.

A photoresist, for example, is used for the mask pattern 41, but configuration may be taken for form it out of an inorganic substance such as silicon oxide. In the present embodiment, the part formed on the substrate 25 in the through-hole 12 is formed by etching the substrate 25 in a vertical direction with respect to the surface 25b of the substrate 25 by using a so-called bosch process. Also, part of the insulating member 24 (the insulating layer 22, the insulating layer 21, the insulating layer 20) of the through-hole 12 is formed by performing anisotropic etching by dry etching (Capacitively-coupled RIE, or the like, which uses a gas mixture of CF4, C4F8, O2, and Ar), for example. By this, the through-hole 12 is formed, and a side of the substrate 25 of the electrode pad PAD is exposed.

Figure 5F:
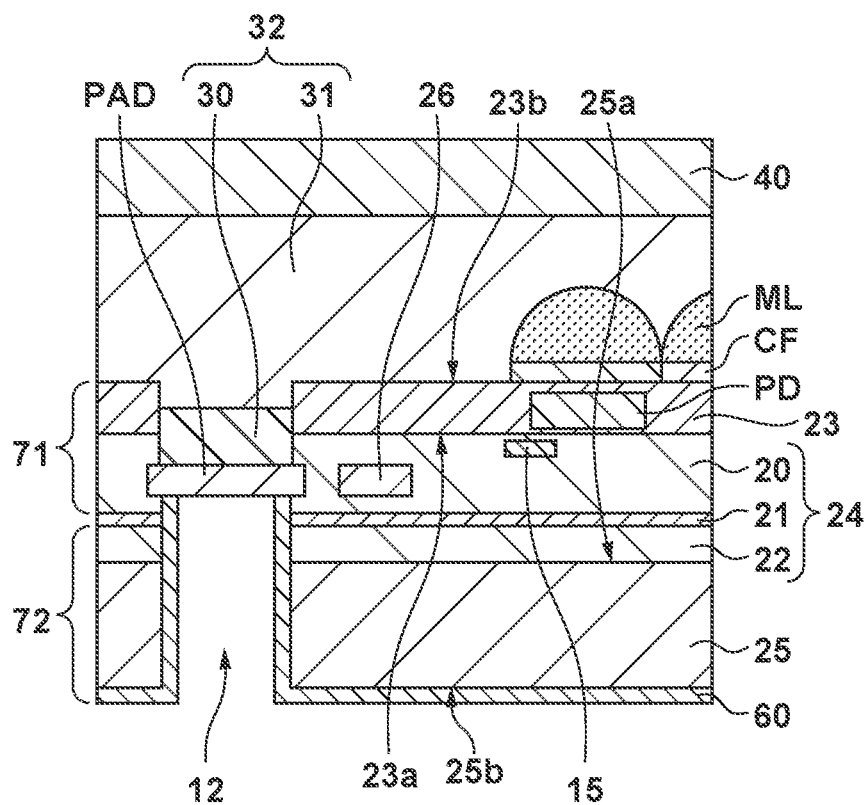

After the side of the substrate 25 of the electrode pad PAD is exposed, in the step illustrated in FIG. 5F, the insulating member 60 is formed on the side surfaces of the through-hole 12 and the surface 25b of the substrate 25 which includes an exposed surface of the electrode pad PAD. The insulating member 60 may be formed so as to cover the entirety of the surface 25b of the substrate 25. For the insulating member 60, an insulating material such as silicon oxide or silicon nitride, silicon carbide, silicon oxynitride or the like may be used. In the present embodiment, for the insulating member 60, silicon oxide formed by a plasma CVD method is used. The thickness of the insulating member 60 is made to be 1.5 μm on the surface 25b of the substrate 25. After that, by etch back processing, the insulating member 60 on the electrode pad PAD is removed by dry etching (Capacitively-coupled RIE, or the like, which uses a gas mixture of CF4, C4F8, O2, and Ar).

In the step for forming this through-hole 12, the resin layer 30 and the resin layer 31 are disposed in the opening 73 on the side opposite to the through-hole 12 of the electrode pad PAD. By the resin layer 30 with the high Young's modulus, the supporting rigidity for supporting the electrode pad PAD during the process for forming the through-hole 12 can be enhanced, and the stability of the manufacturing process improved, and thereby a yield rate can be improved.

Figure 5G:
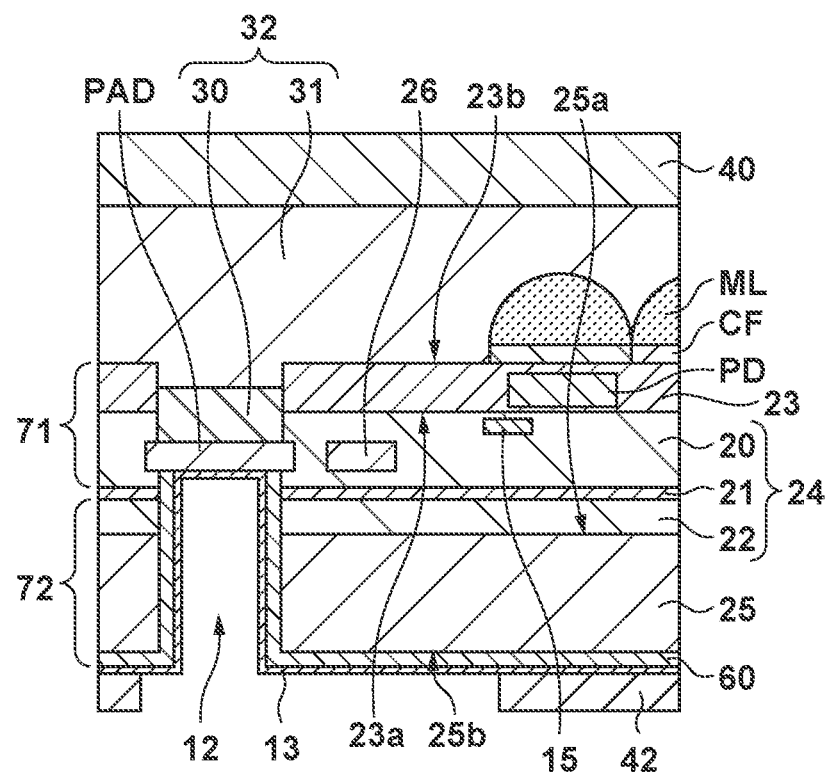

Next, in the step illustrated in FIG. 5G, the seed layer 13 which is used as a barrier metal and a seed metal is formed on the insulating member 60 and on the electrode pad PAD by using a sputtering method or the like. Furthermore, on the seed layer 13, a mask pattern 42 is formed. The mask pattern 42 may be disposed at a position where the conductive pattern 14 is not formed.

The seed layer 13 may be configured from one metal layer or an alloy or the like, and may be a stacked structure of metal or alloy comprising a plurality or different compositions. In the present embodiment, the seed layer 13 is assumed to be a stacked structure of titanium (Ti), the barrier metal, and copper (Cu), the seed metal, formed using a sputtering method.

Figure 5H:
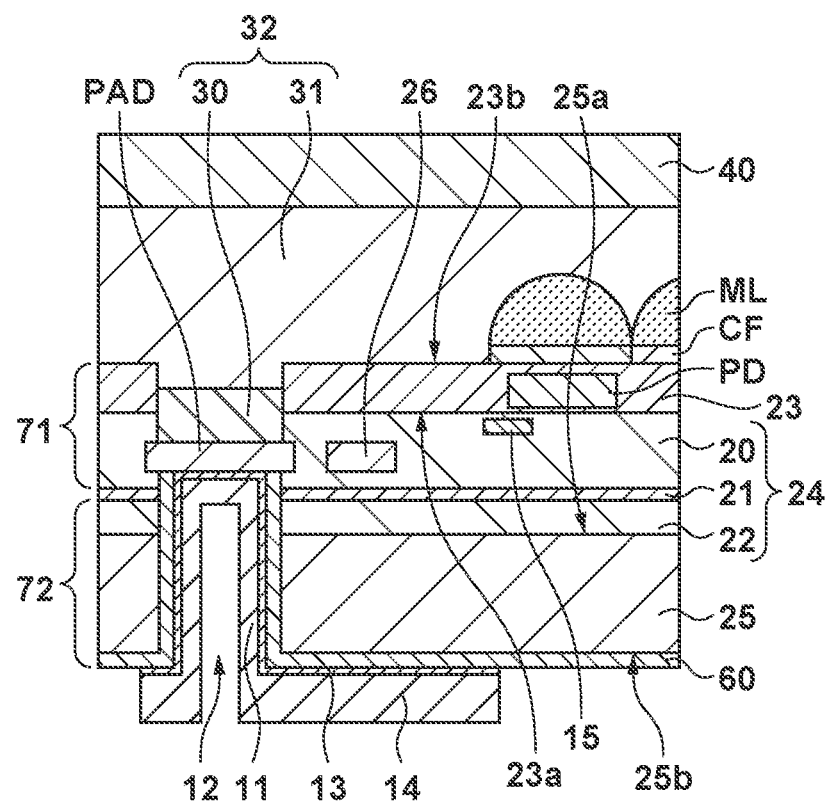

After forming the seed layer 13, the through via 11 disposed within the through-hole 12 and the conductive pattern 14 disposed in the surface 25b of the substrate 25 are formed in the step illustrated in FIG. 5H. More specifically, a conductive film is formed by using a metal plating method in relation to the surface 25b of the substrate 25 on which the mask pattern 42 is disposed. Next, by removing the mask pattern 42 and removing, by a wet etching method or the like, the seed layer 13 under the mask pattern 42 where the conductive film disposed is not formed, the through via 11 and the conductive pattern 14 are formed.

After forming the through via 11 and the conductive pattern 14, a solder resist is applied by a publicly known semiconductor manufacturing process, and a protective film 80 provided with an opening in which a solder ball for connecting an external terminal is placed is formed by using a photolithography method. Furthermore, a solder ball 16 is positioned in the opening of the protective film 80. After that, a step of dicing or the like is performed, and the semiconductor apparatus 10 having the configuration illustrated in FIG. 1 is manufactured.

Application Example

Below, as an application example of the semiconductor apparatus 10 according to the foregoing embodiment, description will be given for an equipment comprising: the semiconductor apparatus 10 on which the photoelectric conversion element PD, as illustrated in FIGS. 1 to 4 is disposed, and that functions as a photoelectric conversion apparatus; and a processing apparatus for processing signals outputted from the semiconductor apparatus 10. Here, an equipment in which the semiconductor apparatus 10 that functions as the photoelectric conversion apparatus is incorporated as an image capturing apparatus will be given as an example. The equipment in which the semiconductor apparatus 10 is incorporated as an image capturing apparatus may be, for example, an electric equipment such as a camera or smartphone. The camera conceptually encompasses not only apparatuses whose principal purpose is image capturing but also apparatuses (for example, a personal computer or a mobile terminal such as a tablet) additionally provided with an image capturing function.

Also, even in a processing apparatus for processing signals outputted from the semiconductor apparatus 10, for example, a substrate is attached, and a through via is provided, and in the case where an opening is provided on the opposite side of the through via of the electrode pad, there may be a structure of an opening similar to the semiconductor apparatus 10 described above. That is to say a resin layer having a high Young's modulus may be disposed on the side of the electrode pad of the opening, and a resin layer having a low Young's modulus may be disposed on top of the resin layer with the high Young's modulus.

Figure 6:
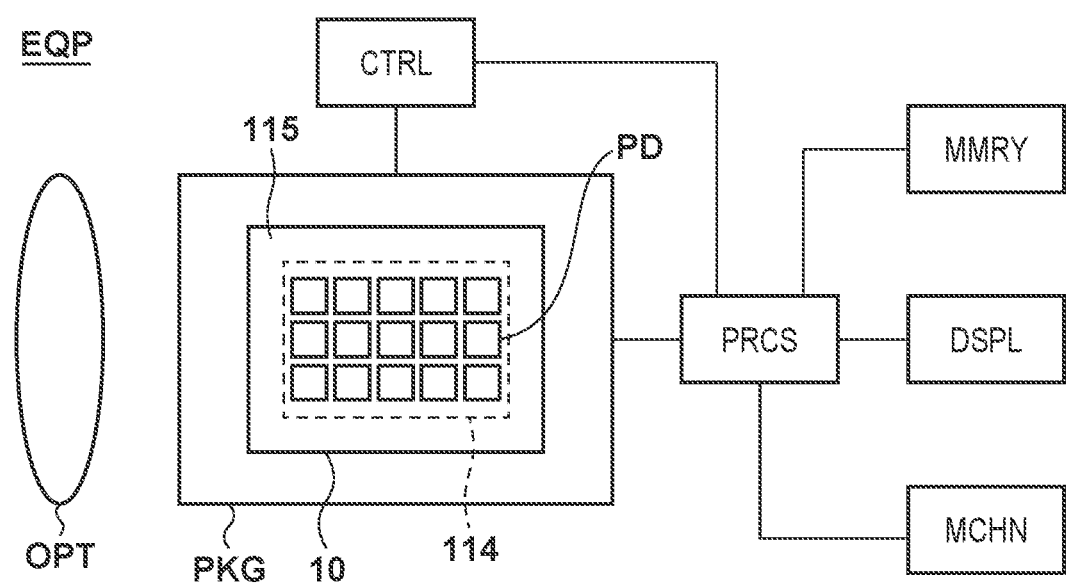
FIG. 6 is a view illustrating an example of a configuration of an equipment in which the semiconductor apparatus in the present embodiment is embedded.

FIG. 6 is a schematic diagram of an equipment EQP in which the semiconductor apparatus 10 which functions as the photoelectric conversion apparatus is provided. An example of the equipment EQP is an electric equipment (information equipment) such as a camera or smartphone as described above, an office equipment such as a copying machine or scanner, a transportation equipment such as an automobile, airplane, ship, or railroad car, a medical equipment such as an endoscope or a radiation image capturing apparatus, an analysis equipment such as a scanning electron microscope or transmission electron microscope, or an industrial equipment such as an industrial robot.

The equipment EQP, in addition to the above-described semiconductor apparatus 10, in which the photoelectric conversion element PD is arranged in a pixel region 114 disposed in an array, may include a package PKG that houses the semiconductor apparatus 10. The package PKG can include a base on which the semiconductor apparatus 10 is fixed, a lid made of glass or the like facing the semiconductor apparatus 10, and a connection member such as a bonding wire, a bump, or the like for connecting a terminal arranged on the base and a terminal (the solder ball 16 or the like) arranged on the semiconductor apparatus 10. The equipment EQP can further include at least one of an optical system OPT, a control apparatus CTRL, a processing apparatus PRCS, a display apparatus DSPL, and a storage apparatus MMRY. The optical system OPT is something that forms an image on the pixel region 114 in which the photoelectric conversion element PD of the semiconductor apparatus 10 is disposed, and may be a lens, a shutter, and a mirror, for example. The control apparatus CTRL is something that controls an operation of the semiconductor apparatus 10, and may be a semiconductor device such as an ASIC, for example. The processing apparatus PRCS is something that processes signals outputted from the semiconductor apparatus 10, and a semiconductor device such as a CPU, an ASIC, or the like for configuring and AFE (analog front end) or a DFE (digital front end). The display apparatus DSPL is an EL display apparatus or a liquid crystal display apparatus for displaying information (images) obtained by the semiconductor apparatus 10. The storage apparatus MMRY is a magnetic device or a semiconductor device for storing information (images) obtained by the semiconductor apparatus 10. The storage apparatus MMRY is a volatile memory such as an SRAM or DRAM or a nonvolatile memory such as a flash memory or hard disk drive. The mechanical apparatus MCHN has a movable portion or a propulsion unit such as a motor, an engine, or the like. The mechanical apparatus MCHN in the camera can drive the components of the optical system OPT in order to perform zooming, an in-focus operation, and a shutter operation. In the equipment EQP, a signal outputted from the semiconductor apparatus 10 is displayed on the display apparatus DSPL, and is transmitted to an external unit by a communication apparatus (not shown) that the equipment EQP comprises. Therefore, the equipment EQP may further comprise the storage apparatus MMRY or the processing apparatus PRCS in addition to a storage circuit unit or an arithmetic circuit included in a peripheral region 115 such as a control/signal processing circuit or the like that the semiconductor apparatus 10 comprises. Also, the above-described through via 11 and opening 73 may be disposed in the peripheral region 115 of the semiconductor apparatus 10.

It is expected that the above-described equipment will experience large temperature changes in use in the case where it is used as an onboard camera of a vehicle, for example. The semiconductor apparatus 10 of the present embodiment, by the resin layer 31 with the lower Young's modulus than the resin layer 30 being disposed therein, is enabled to disperse to the resin layer 31 stress on the insulating layer 21 due to expansion and contraction caused by changes in temperature of the metal of the through via 11 or the like and thereby alleviate such stress. That is, it is possible to provide a semiconductor apparatus 10 that is highly reliable in relation to environmental factors such as temperature in the usage environment of an equipment such as is described above.

Figure 7A:
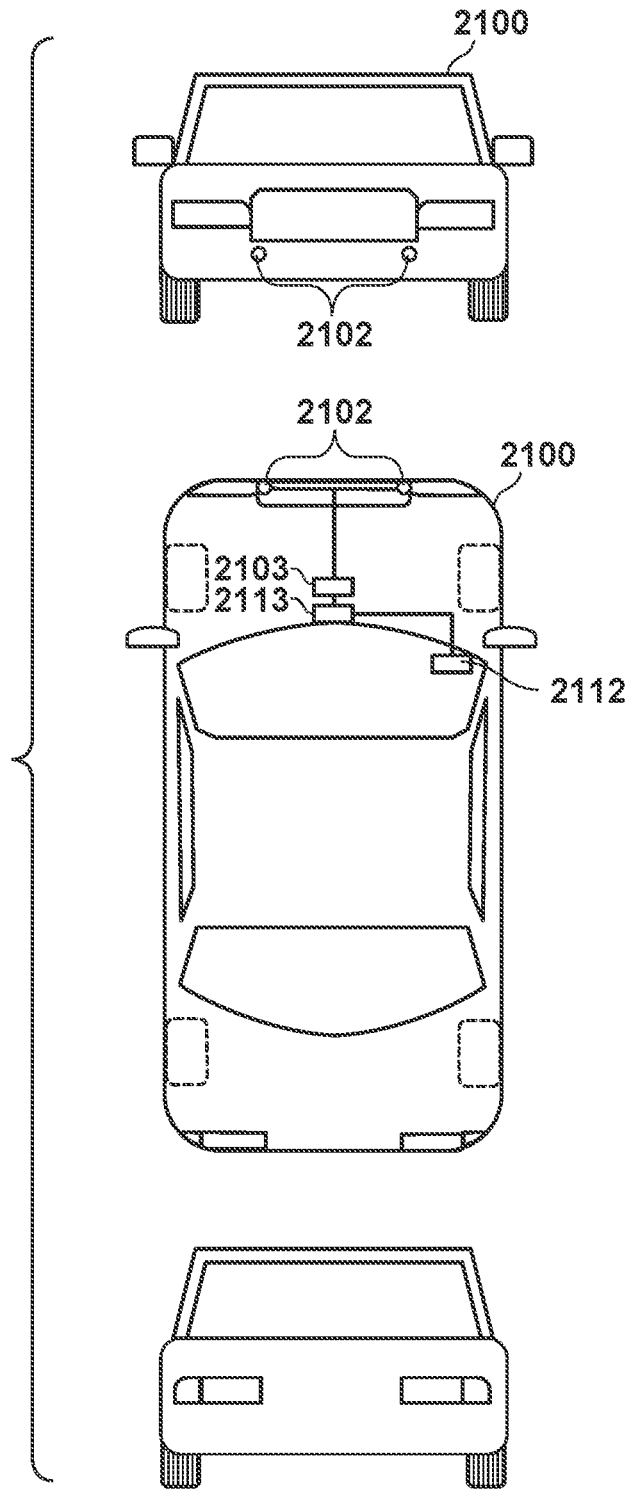
FIGS. 7A and 7B are views illustrating an example of a configuration of an equipment in which the semiconductor apparatus in the present embodiment is provided.

A camera in which the semiconductor apparatus 10, which functions as a photoelectric conversion apparatus is embedded may be applied to a monitoring camera or an onboard camera to be installed on a transportation equipment such as an automobile, an airplane, a ship, a railway car, or the like. An example in which a camera, in which is embedded the semiconductor apparatus 10 which functions as a photoelectric conversion apparatus in which the photoelectric conversion element PD is disposed, is applied to a transportation equipment will be given. The transportation equipment 2100 is, for example, a car comprising the onboard camera 2101 illustrated in FIGS. 7A and 7B. FIG. 7A schematically shows the outer appearance and the main internal structure of the transportation equipment 2100. The transportation equipment 2100 includes a photoelectric conversion apparatus 2102, an image capturing system integrated circuit (ASIC: Application Specific Integrated Circuit) 2103, a warning apparatus 2112, and a control apparatus 2113.

The above-described semiconductor apparatus 10 is used for the photoelectric conversion apparatus 2102. The warning apparatus 2112 warns a driver when it receives an abnormality signal from an image capturing system, a vehicle sensor, a control unit, or the like. The control apparatus 2113 comprehensively controls the operations of the image capturing system, the vehicle sensor, the control unit, and the like. Note that the transportation equipment 2100 need not include the control apparatus 2113. In this case, the image capturing system, the vehicle sensor, and the control unit each individually include a communication interface and transmit/receive control signals via a communication network (for example, a CAN standard).

Figure 7B:
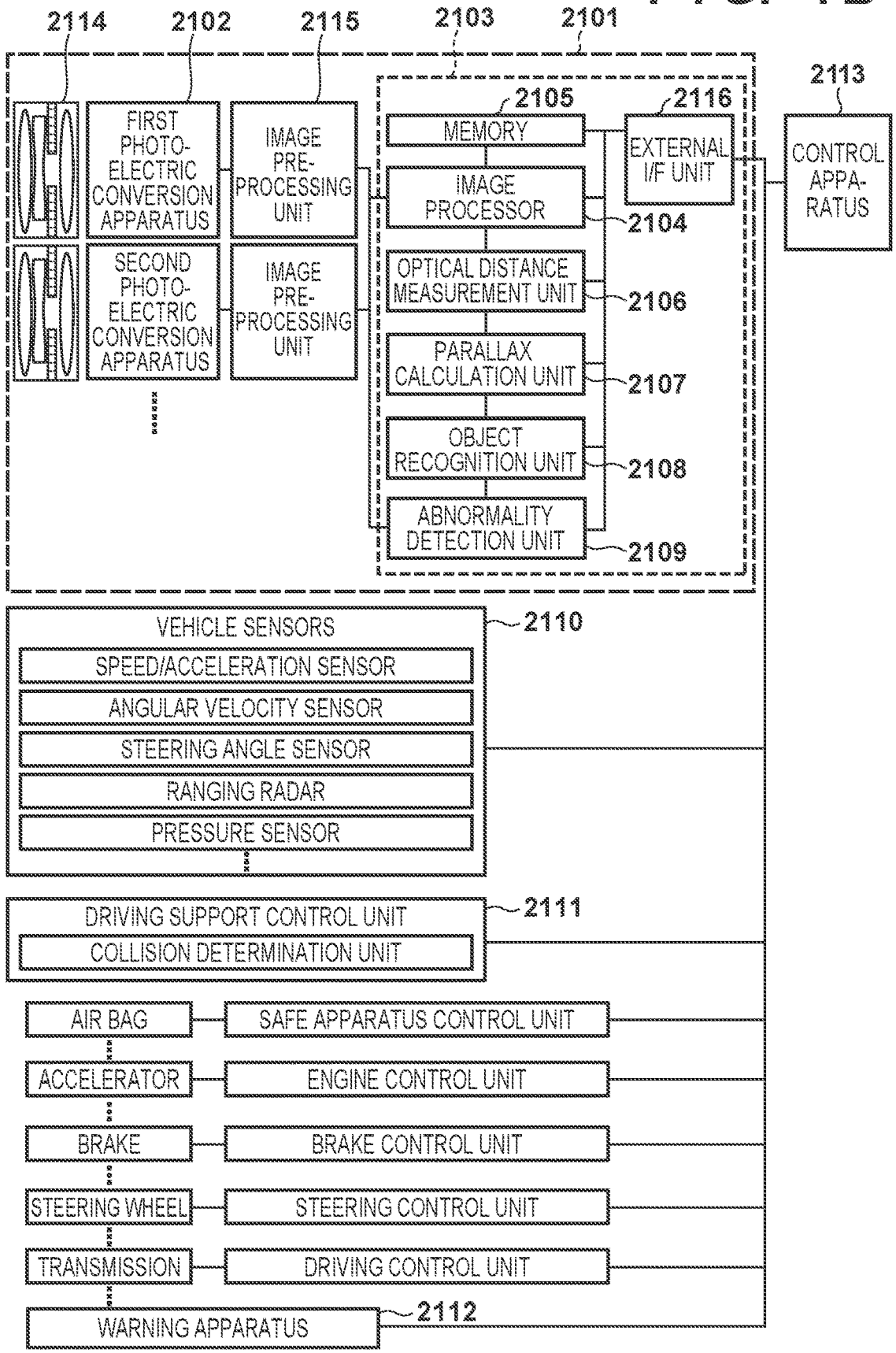

FIG. 7B is a block diagram illustrating a system configuration of the transportation equipment 2100. The transportation equipment 2100 includes a first photoelectric conversion apparatus 2102 and a second photoelectric conversion apparatus 2102. That is, the onboard camera according to this embodiment is a stereo camera. An object image is formed by each optical unit 2114 on each photoelectric conversion apparatus 2102. A pixel signal output from each photoelectric conversion apparatus 2102 is processed by an image pre-processing unit 2115 and transmitted to the image capturing system integrated circuit 2103. The image pre-processing unit 2115 performs processing such as S-N calculation and synchronization signal addition.

The image capturing system integrated circuit 2103 comprises an image processor 2104, a memory 2105, an optical distance measurement unit 2106, a parallax calculation unit 2107, an object recognition unit 2108, an abnormality detection unit 2109, and an external interface (I/F) unit 2116. The image processor 2104 generates an image signal by processing signals output from the pixel of each photoelectric conversion apparatus 2102. The image processor 2104 also performs correction of the image signal and interpolation of an abnormal pixel. The memory 2105 temporarily holds the image signal. The memory 2105 may also store the position of a known abnormal pixel in the photoelectric conversion apparatus 2102. The optical distance measurement unit 2106 uses the image signal to perform focusing or distance measurement of an object. The parallax calculation unit 2107 performs object collation (stereo matching) of a parallax image. The object recognition unit 2108 analyzes the image signal to recognize objects such as a transportation equipment, a person, a road sign, and a road. The abnormality detection unit 2109 detects the fault or an error operation of the photoelectric conversion apparatus 2102. When a fault or an error operation is detected, the abnormality detection unit 2109 transmits a signal indicating the detection of an abnormality to the control apparatus 2113. The external I/F unit 2116 mediates exchange of information between the units of the image capturing system integrated circuit 2103 and the control apparatus 2113 or the various kinds of control units.

The transportation equipment 2100 includes the vehicle information acquisition unit 2110 and the driving support unit 2111. The vehicle information acquisition unit 2110 includes vehicle sensors such as a speed/acceleration sensor, an angular velocity sensor, a steering angle sensor, a ranging radar, and a pressure sensor.

The driving support unit 2111 includes a collision determination unit. Based on the pieces of information from the optical distance measurement unit 2106, the parallax calculation unit 2107, and the object recognition unit 2108, the collision determination unit determines whether there is the possibility of a collision with an object. The optical distance measurement unit 2106 and the parallax calculation unit 2107 are examples of distance information acquisition units that acquire distance information of a target object. That is, distance information includes pieces of information concerning the parallax, the defocus amount, the distance to the target object, and the like. The collision determination unit may use one of these pieces of distance information to determine the possibility of a collision. Each distance information acquisition unit may be implemented by specially designed hardware or a software module.

An example in which the driving support unit 2111 controls the transportation equipment 2100 so not to collide with another object was given, but it is also possible to apply the invention to control for automated driving in which another vehicle is being followed or control for automated driving in which going out of a traffic lane is being avoided, or the like.

The transportation equipment 2100 further comprises a drive apparatus used for movement of support thereof of an air bag, an accelerator, a brake, a steering wheel, a transmission, an engine, a motor, a wheel, a propeller or the like. The transportation equipment 2100 also includes control units for these apparatuses. Each control unit controls a corresponding drive apparatus based on a control signal of the control apparatus 2113.

The semiconductor apparatus 10 functions as a photoelectric conversion apparatus of the present embodiment, and can be widely applied to transportation equipment such as, in addition to automobiles, ships, airplanes, railway cars or the like, as well as industrial equipment such as industrial robots. In addition, the semiconductor apparatus 10 is applicable not only to transportation equipment but also broadly to equipment that use object recognition, such as various equipment mentioned above or an ITS (Intelligent Transportation System). Also, the configuration of the resin layer in the opening 73 of the semiconductor apparatus 10 may be applied to another semiconductor apparatus such as a processor, a memory, or the like, in addition to photoelectric conversion apparatuses.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A semiconductor apparatus, comprising:
   a first substrate having a photoelectric conversion element;
   a second substrate overlapped with the first substrate; and
   an electrode portion disposed at a depth between the first substrate and the second substrate,
   wherein the first substrate has an opening at a position overlapping the electrode portion,
   wherein a through via is disposed to pass through the second substrate, and
   wherein in a cross-sectional view, an insulating member extends from one end of a side wall of the opening to another end of the side wall of the opening.

2. The semiconductor apparatus according to claim 1, wherein the insulating member is a first resin layer overlapping the electrode portion.

3. The semiconductor apparatus according to claim 2, wherein a second resin layer, which is different in material from the first resin layer, is disposed on the first resin layer.

4. The semiconductor apparatus according to claim 1, wherein the through via is arranged at a position overlapping the opening.

5. The semiconductor apparatus according to claim 1, further comprising a third substrate overlapping the first substrate,
   wherein the first substrate is disposed between the second substrate and the third substrate.

6. The semiconductor apparatus according to claim 5, wherein each of the first substrate and the second substrate is a semiconductor substrate, and
   wherein the third substrate is a light transmissive plate.

7. The semiconductor apparatus according to claim 1, wherein a boundary between the through via and the second substrate is covered by a metal layer, and
   wherein the metal layer connects the electrode portion to an external terminal.

8. An equipment, comprising:
   the semiconductor apparatus according to claim 1; and
   a processing apparatus configured to process a signal outputted from the semiconductor apparatus.

9. A semiconductor apparatus, comprising:
   a first substrate having a photoelectric conversion element;
   a second substrate overlapped with the first substrate;
   an insulating member between the first substrate and the second substrate; and an electrode portion disposed at a depth between the first substrate and the second substrate, wherein, in the first substrate, an opening for exposing the electrode portion to outside of the first substrate is arranged at a position overlapping the electrode portion, and wherein a through via is disposed to pass through the second substrate.

10. The semiconductor apparatus according to claim 9, wherein a second resin layer is disposed above the electrode portion.

11. The semiconductor apparatus according to claim 10, wherein a first resin layer, which is different in material from the second resin layer, is disposed between the electrode portion and the second resin layer.

12. The semiconductor apparatus according to claim 11, wherein the first resin layer is disposed within the opening.

13. The semiconductor apparatus according to claim 11, wherein the first resin layer covers a portion of a side surface of the opening without intervention of the second resin layer.

14. The semiconductor apparatus according to claim 9, further comprising a third substrate overlapping the first substrate, wherein the first substrate is disposed between the second substrate and the third substrate.

15. The semiconductor apparatus according to claim 14, wherein each of the first substrate and the second substrate is a semiconductor substrate, and wherein the third substrate is a light transmissive plate.

16. The semiconductor apparatus according to claim 9, wherein the through via is arranged at a position overlapping the opening.

17. The semiconductor apparatus according to claim 9, wherein a boundary between the through via and the second substrate is covered by a metal layer, and wherein the metal layer connects the electrode portion to an external terminal.

18. An equipment, comprising:

the semiconductor apparatus according to claim 9; and a processing apparatus configured to process a signal outputted from the semiconductor apparatus.

* * * * *